US009329948B2

(12) United States Patent
Li et al.

(10) Patent No.: US 9,329,948 B2
(45) Date of Patent: May 3, 2016

(54) MEASURING CELL DAMAGE FOR WEAR LEVELING IN A NON-VOLATILE MEMORY

(75) Inventors: Yan Li, San Jose, CA (US); Alexander Hubris, San Jose, CA (US); Hao Zhong, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/620,982

(22) Filed: Sep. 15, 2012

(65) Prior Publication Data

US 2014/0082459 A1    Mar. 20, 2014

(51) Int. Cl.
| | |
|---|---|
| G11C 29/00 | (2006.01) |
| G06F 11/16 | (2006.01) |
| G06F 12/02 | (2006.01) |
| G11C 16/34 | (2006.01) |
| G11C 29/42 | (2006.01) |
| G11C 29/50 | (2006.01) |
| G11C 29/52 | (2006.01) |

(52) U.S. Cl.
CPC ........ *G06F 11/1666* (2013.01); *G06F 12/0246* (2013.01); *G11C 16/3495* (2013.01); *G11C 29/42* (2013.01); *G11C 29/50* (2013.01); *G11C 29/52* (2013.01); *G06F 2212/7211* (2013.01)

(58) Field of Classification Search
USPC .................. 714/773; 711/103; 365/185.25
See application file for complete search history.

(56) References Cited

U.S. PATENT DOCUMENTS

| | | | |
|---|---|---|---|
| 5,341,339 A | 8/1994 | Wells | |
| 5,586,285 A | 12/1996 | Hasbun et al. | |
| 6,341,085 B1 | 1/2002 | Yamagami et al. | |
| 6,347,051 B2 | 2/2002 | Yamagami et al. | |
| 7,386,655 B2 | 6/2008 | Gorobets et al. | |
| 7,441,067 B2 | 10/2008 | Gorobets et al. | |
| 7,552,271 B2 | 6/2009 | Sinclair et al. | |
| 7,653,778 B2 | 1/2010 | Merry, Jr. et al. | |
| 7,849,275 B2 | 12/2010 | Danilak | |
| 7,903,486 B2 | 3/2011 | Danilak | |
| 8,230,184 B2 | 7/2012 | Danilak | |
| 8,339,881 B2 | 12/2012 | Danilak | |
| 2007/0180186 A1 | 8/2007 | Cornwell et al. | |
| 2008/0082736 A1 | 4/2008 | Chow | |
| 2008/0168215 A1* | 7/2008 | Jiang et al. | 711/103 |
| 2008/0170447 A1* | 7/2008 | Jiang et al. | 365/189.011 |

(Continued)

OTHER PUBLICATIONS

Chanik Park, Prakash Talawar, Daesik Won, MyungJin Jung, JungBeen Im, Suksan Kim and Youngjoon Choi, "A High Performance Controller for NAND Flash-based Solid State Disk (NSSD)," in Non-volatile Semiconductor Memory Workshop (NVSMW) Digest Technical Papers, 2006, pp. 17-20 (4 sheets).

(Continued)

*Primary Examiner* — Sam Rizk
(74) *Attorney, Agent, or Firm* — Taylor English Duma LLP

(57) ABSTRACT

An NVM controller measures cell damage for wear leveling in an NVM, thus improving performance, reliability, lifetime, and/or cost of a storage sub-system, such as an SSD. In a first aspect, the controller determines that an error reading a page of NVM was caused by cell damage and/or cell leakage. The controller reprograms and immediately reads back the page, detecting that the error was caused by cell damage if an error is detected during the immediate read. In a second aspect, the cell damage is tracked by updating cell damage counters for pages and/or blocks of NVM. In a third aspect, wear leveling is performed based at least in part upon measured cell damage for pages and/or blocks of NVM.

22 Claims, 6 Drawing Sheets

(56) References Cited

U.S. PATENT DOCUMENTS

| | | | |
|---|---|---|---|
| 2008/0294813 A1 | 11/2008 | Gorobets | |
| 2008/0313388 A1 | 12/2008 | Chow et al. | |
| 2008/0320214 A1 | 12/2008 | Ma | |
| 2009/0063895 A1 | 3/2009 | Smith | |
| 2009/0094409 A1 | 4/2009 | Yeh et al. | |
| 2010/0017650 A1 | 1/2010 | Chin et al. | |
| 2010/0020610 A1 | 1/2010 | Gutsche | |
| 2010/0082890 A1* | 4/2010 | Heo et al. | 711/103 |
| 2011/0004722 A1 | 1/2011 | Jeddeloh | |
| 2011/0022931 A1 | 1/2011 | Eleftheriou | |
| 2011/0041039 A1* | 2/2011 | Harari et al. | 714/773 |
| 2011/0131367 A1 | 6/2011 | Park et al. | |
| 2011/0235434 A1* | 9/2011 | Byom et al. | 365/185.25 |
| 2012/0030506 A1 | 2/2012 | Post | |
| 2012/0216085 A1 | 8/2012 | Weingarten et al. | |
| 2013/0124792 A1* | 5/2013 | Melik-Martirosian et al. | 711/103 |
| 2013/0262942 A1* | 10/2013 | Chu | 714/718 |

OTHER PUBLICATIONS

R. Micheloni, L.Crippa, A, Marelli, "InsideNANDFlashMemories" Springer Science +Business Media B.V. 2010 ISBN 978-90-481-9430-8, pp. 515-536, formatted as 12 sheets.

R. Micheloni, L.Crippa, A, Marelli, "InsideNANDFlashMemories" Springer Science +Business Media B.V. 2010 ISBN 978-90-481-9430-8, pp. 38-43 and related footnote pp. 52-53, formatted as 4 sheets.

K. Takeuchi, "NAND Successful as a Media for SSD" IEEE International Solid-State Circuits Conference Tutorial T7, 2008, pp. 1-81 (81 sheets).

A. Olson, D. Langlois, "Solid State Drives Data Reliability and Lifetime" White Paper, Apr. 7, 2008. pp. 1-27 (27 sheets).

J. Ren, Q. Yang. "I-Cash: Intelligently Coupled Array of SSD and HDD" Dept. of Electical, Computer, and Biomedical Engineering. 2011. ISBN-978-4244-9435-4, 278-289 (12 sheets).

European Search Report in related case EP13184158.7, 7 pages.

Taiwan Office Action for serial No. 102133261, filed Mar. 13, 2013, mailed Jun. 15, 2015, 7 pgs.

* cited by examiner

MEASURING CELL DAMAGE FOR WEAR LEVELING IN A NON-VOLATILE MEMORY

BACKGROUND

1. Field

Advancements in non-volatile storage technology are needed to provide improvements in cost, profitability, performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

Various aspects of flash memory as used by Solid State Disk (SSD) controllers will now be described in part to establish a technology background and in part to establish antecedents for nomenclature used in the balance of the specification. The minimal size of data readable by the SSD controller from Non-Volatile Memory (NVM) is a "read unit" that is protected by included error correction, such as a Low-Density Parity-Check (LDPC) code. In some contexts, a read unit is referred to as a "codeword". In some embodiments, each read unit contains approximately 4K to approximately 32K bits of user data, plus error correction overhead. Under command of the SSD controller, those bits are read from NVM memory cells (e.g. via an array access of one or more portions of the NVM memory cells), which depending on the technology as discussed below, may hold one or more bits per cell. In some embodiments, for security reasons an SSD controller encrypts the data prior to writing the data to NVM. In some embodiments, in view of circuit design limitations with respect to long strings of identically programmed cells, an SSD controller scrambles the data prior to writing the data to NVM.

Considered individually, each cell has a particular stored (programmed) charge that corresponds to a device threshold voltage for that cell, and further corresponds to the logical bit values being stored in the cell. While ideally all of the cells in the NVM would have identical device threshold voltages for the logical bit values stored, in practice for a variety of reasons the device threshold voltages differ across the cells in probability distributions along the device threshold voltage axis (e.g., "device threshold voltage distributions") that are similar to a Gaussian in shape.

Thus considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^{}N$ states and the same number of device threshold voltage distributions. Generally, $(2^{}N)-1$ different read thresholds (read voltage references $V_{READ1}$ through $V_{READ(N-1)}$) are required by read circuits in the NVM to distinguish between the $2^{**}N$ states.

Continuing from above, for Single-Level Cell (SLC) flash memories, N=1. SLC memories thus store one-bit per cell of storage, have two device threshold voltage distributions (one for zeroes and another for ones), and require a single read threshold, read voltage reference $V_{READ1}$. From lower to higher device threshold voltages, the two device threshold voltage distributions are known as the E (Erased) state and D1 (first Data) state. While arbitrary, a common mapping (coding) is to assign logical one to the E state and logical zero to the D1 state. Thus references to zeroes and ones are proxy references for respective decodings of the D1 state and the E state.

Continuing further from above, for Multi-Level Cell (MLC) flash memories, N >1. MLC memories thus store more than one bit per cell, have more than two device threshold voltage distributions, and require multiple different read thresholds to distinguish the distributions. For example, a 4LC memory (e.g. flash memory) stores two bits per cell, has four device threshold voltage distributions, and generally requires three read thresholds (read voltage references $V_{READ1}$, $V_{READ2}$, and $V_{READ3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus references to one or more of the 11, 10, 00, and 01 states, are proxy references for respective decodings of the E, D1, D2, and D3 states.

With respect to address mapping used for the states of an MLC, each can be said to have a Most Significant Bit (MSB) and a Least Significant Bit (LSB) (and for more than two bits per cell, bits of significance in between). While there are various ways that MLC NVMs program their cells, the following approach is common. An initial programming round (a manipulation of the charge distributions) establishes the LSB, e.g., writes the "lower pages". This is done loosely in the same manner as for writing an SLC, e.g., a charge manipulation that establishes the E state device threshold voltage distribution and a second state device threshold voltage distribution. Depending on the binary sequence used, the second state device threshold voltage distribution is similar to the D1 state device threshold voltage distribution, similar to the D2 state device threshold voltage distribution, or between the D1 and D2 state device threshold voltage distributions. For MLC, one or more additional programming rounds further manipulate the device threshold voltage distributions (in number, location along the device threshold voltage axis, and in shape), as required per the number of levels of the MLC. More particularly, one or more subsequent programming operations write the "middle pages" (if any, for more than two bits per cell), and a last programming operation establishes the MSB, e.g., writes the "upper pages". For example, in a 4LC (2-bit per cell MLC), the E distribution and the second distribution of the first program round are respectively bifurcated by a second program round into E and D1 distributions and D2 and D3 distributions.

NVM cells have a finite write endurance, and writes will eventually wear out (e.g. damage) the cell so that it cannot correctly store data. Causes of cell damage include oxide trapping and oxide breakdown. Typically write endurance is described in terms of program-erase (P/E) cycles and NVMs are specified for a certain level (e.g. an SLC NVM cell might be rated for 10K P/E cycles under particular conditions). Many NVMs are managed using wear leveling techniques to improve the reliability, lifetime and/or performance by reducing cell damage. Traditionally, wear leveling evenly distributes P/E cycles across blocks of the NVM to avoid prematurely wearing out (e.g. causing cell damage to) any individual block. This approach implicitly assumes that P/E cycles are equivalent to wear. Wear is estimated by measuring the number of P/E cycles in order to optimize writes to the NVM.

In practice, write endurance and wear are determined by a variety of factors beyond P/E cycles, including Process, Voltage, Temperature (PVT), and dwell time (the length of time between P/E cycles). Some NVM cells might exceed the specified endurance due to statistical variation in manufacturing. Similarly, some NVM cells might exceed the specified endurance due to more favorable conditions (e.g. if the NVM is rated for 100° C., but operates at 50° C.).

Synopsis

The invention may be implemented in numerous ways, e.g., as a process, an article of manufacture, an apparatus, a system, a composition of matter, and a computer readable medium such as a computer readable storage medium (e.g., media in an optical and/or magnetic mass storage device such as a disk, or an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the Detailed Description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

In various embodiments and/or usage scenarios, wear leveling improves performance, cost, reliability and/or lifetime of an NVM. Some wear leveling techniques approximate cell wear by the number of P/E cycles and write data to blocks of NVM based upon the number of P/E cycles. This approach is popular because counting the number of P/E cycles to a cell is simpler than measuring the actual wear (e.g. damage) to the cell.

The inventors believe they are the first to note the significance, with respect to performance, cost, reliability and/or lifetime, the benefits of measuring cell damage for wear leveling in an NVM. More particularly, the inventors believe they are the first to note that page read errors caused by uni-directional shifts in voltage in an NVM cell are indicative of cell damage and/or cell leakage (e.g. retention failure) and that reprogramming (e.g. erasing the stored data followed by programming with the stored data) the cell and immediately reading the cell can detect that the error was caused by cell damage. In some usage scenarios, measuring cell damage is more accurate than estimating cell damage via P/E cycles, because measured cell damage accounts for other factors such as PVT, and dwell time. Cell damage for pages and/or blocks of NVM is tracked, using cell damage counters that are updated when cell damage is detected. Wear leveling techniques that incorporate more accurate measured cell damage information (e.g. cell damage counters) achieve improved performance, cost, reliability and/or lifetime for NVMs. For example, wear leveling based at least in part upon measured cell damage is enabled to exceed the specified P/E cycles for NVM cells that have not been damaged.

BRIEF DESCRIPTION OF DRAWINGS

FIG. 2A is lower page specific, while FIG. 2B is upper page specific.

List of Reference Symbols in Drawings

Figure 1A:
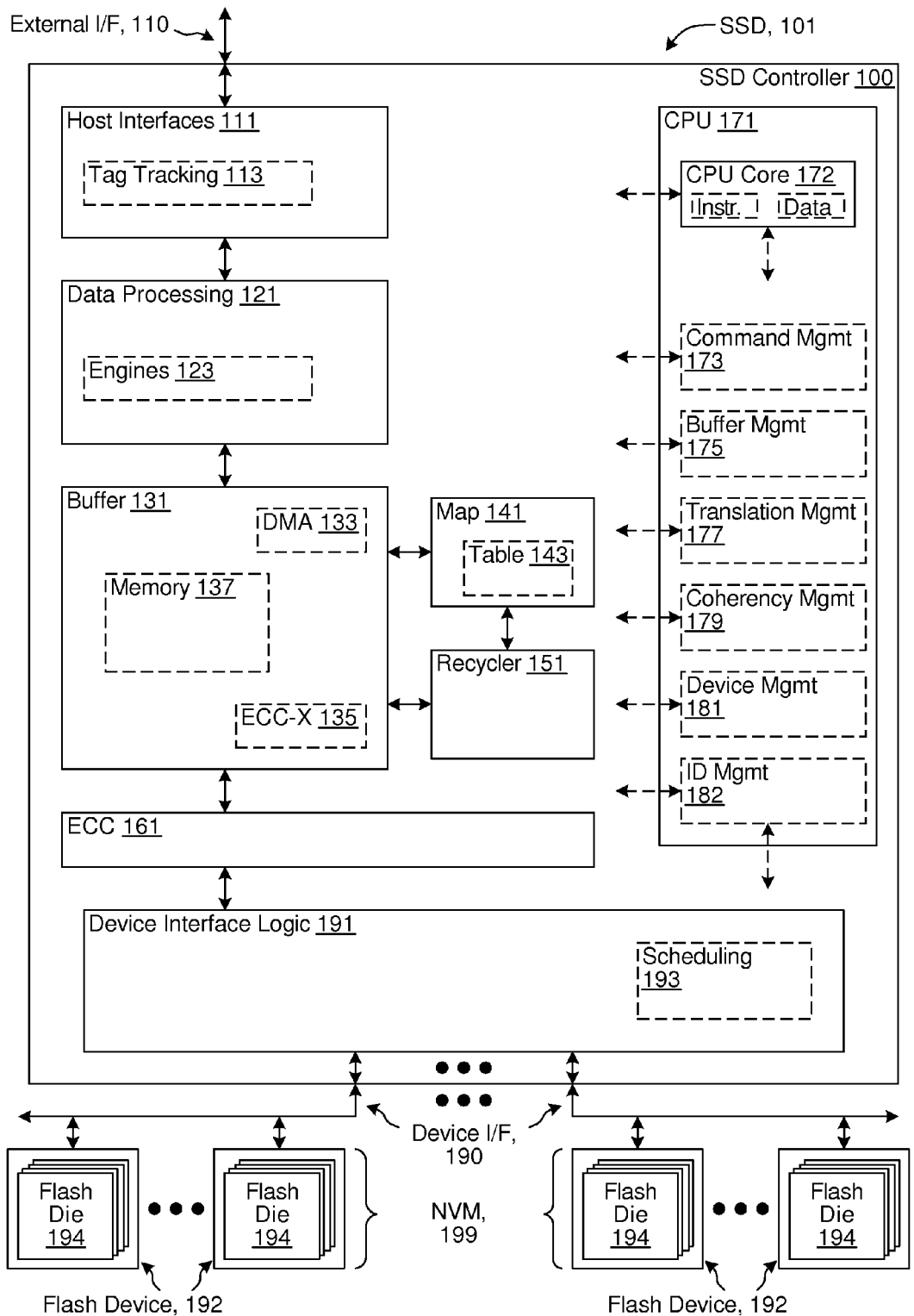
FIG. 1A illustrates selected details of an embodiment of a Solid-State Disk (SSD) including an SSD controller that measures cell damage for wear leveling in a Non-Volatile Memory (NVM).

| Ref. Symbol | Element Name |
|---|---|
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |
| 107D | dotted-arrow (Host Software ←→ I/O Device Communication) |
| 109 | Application |
| 109D | dotted-arrow (Application ←→ I/O Device Communication via driver) |
| 109V | dotted-arrow (Application ←→ I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 131 | Buffer |
| 133 | DMA |
| 135 | ECC-X |
| 137 | Memory |
| 141 | Map |
| 143 | Table |
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 200 | MLC Most-Negative Threshold State, also known as E |
| 201 | MLC Next-Most-Negative Threshold State, also known as D1 |
| 202 | MLC Next-Most-Positive Threshold State, also known as D2 |
| 203 | MLC Most-Positive Threshold State, also known as D3 |
| 210 | MLC Upper Page First Threshold |
| 211 | MLC Lower Page Threshold |

List of Reference Symbols in Drawings -continued

| Ref. Symbol | Element Name |
|---|---|
| 212 | MLC Upper Page Second Threshold |
| 220 | MLC Upper Page First State |
| 221 | MLC Lower Page State |
| 222 | MLC Upper Page Second State |
| 230 | Shifted MLC Upper Page First State |
| 231 | Shifted MLC Lower Page State |
| 232 | Shifted MLC Upper Page Second State |
| 306 | Write Data |
| 310 | Scrambler |
| 311 | Scrambled Write Data |
| 320 | ECC Encoder |
| 321 | ECC Encoded Write Data |
| 332 | NVM Array |
| 334 | Programmable Read Voltage Circuitry |
| 336 | Control/Status Registers |
| 338 | I/O |
| 351 | Read Data |
| 359 | Uncorrected & Scrambled (Raw) Read Data |
| 360 | ECC Decoder |
| 361 | Corrected Read Data |
| 362 | Cell Damage Updates |
| 370 | Descrambler |
| 371 | Unscrambled Read Data |
| 380 | Cell Damage Counters |
| 401 | Apply FEC Decoding Successfully |
| 402 | Error Meets Condition? |
| 403 | Reprogram Page, Read Back Data |
| 404 | Error Detected? |
| 405 | Cell Damage Error |
| 406 | Update Cell Damage Counter |
| 407 | Retention Error |
| 502 | Endurance of Blocks of NVM |
| 504 | Blocks of NVM |
| 506 | Cell Damage Threshold |
| 507 | Cell Damage Values |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

At least some of the various shorthand abbreviations (e.g. acronyms) defined here refer to certain elements used herein.

| Acronym | Description |
|---|---|
| AES | Advanced Encryption Standard |
| AHCI | Advanced Host Controller Interface |
| API | Application Program Interface |
| ASCII | American Standard Code for Information Interchange |
| ATA | Advanced Technology Attachment (AT Attachment) |
| BCH | Bose Chaudhuri Hocquenghem |
| BER | Bit Error Rate |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DES | Data Encryption Standard |
| DMA | Direct Memory Access |
| DNA | Direct NAND Access |
| DRAM | Dynamic Random Access Memory |
| DVD | Digital Versatile/Video Disk |
| DVR | Digital Video Recorder |
| ECC | Error-Correcting Code |
| eMMC | Embedded MultiMediaCard |
| eSATA | external Serial Advanced Technology Attachment |
| FEC | Forward Error Correction |
| GPS | Global Positioning System |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LB | Logical Block |
| LBA | Logical Block Address |
| LDPC | Low-Density Parity-Check |
| LFSR | Linear Feedback Shift Register |
| LPN | Logical Page Number |
| LSB | Least Significant Bit |
| LZ | Lempel-Ziv |
| MLC | Multi-Level Cell |
| MMC | MultiMediaCard |
| MPEG | Moving Picture Experts Group |
| MSB | Most Significant Bit |
| NAS | Network Attached Storage |
| NCQ | Native Command Queuing |
| NVM | Non-Volatile Memory |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| P/E | Program-Erase |
| PHY | PHYsical interface |
| POS | Point Of Sale |
| PVT | Process, Voltage, and Temperature |

-continued

| Acronym | Description |
| --- | --- |
| RAID | Redundant Array of Inexpensive/Independent Disks |
| RASIE | Redundant Array of Silicon Independent Elements |
| ReRAM | Resistive Random Access Memory |
| RS | Reed-Solomon |
| RSA | Rivest, Shamir & Adleman |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SDR | Single-Data-Rate |
| SLC | Single-Level Cell |
| SMART | Self-Monitoring Analysis and Reporting Technology |
| SSD | Solid-State Disk/Drive |
| TCG | Trusted Computing Group |
| UFS | Unified Flash Storage |
| USB | Universal Serial Bus |
| VF | Virtual Function |
| WAN | Wide Area Network |

EXAMPLE EMBODIMENTS

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
in a Non-Volatile Memory (NVM) comprising one or more portions, each portion comprising one or more cells, measuring cell damage for one or more of the cells; and
performing wear leveling on the portions, based at least in part upon at least some results of the measuring.

EC2) The method of EC1, wherein the cells are a particularly chosen subset.

EC3) The method of EC2, wherein the particularly chosen subset is a reserved subset.

EC4) The method of EC2, wherein the particularly chosen subset is physically different with respect to a complement of the particularly chosen subset.

EC5) The method of EC2, wherein the particularly chosen subset is an arbitrary subset of the NVM.

EC6) The method of EC1, wherein the measuring comprises detecting one or more of programming failure and erase failure.

EC7) The method of EC1, wherein the cell damage is a result of one or more of oxide trapping and oxide breakdown.

EC8) The method of EC1, wherein the measuring comprises:
determining that an error reading from at least one of the cells of a particular one of the portions is a result of one or more of cell damage and cell leakage; and
detecting that the error was a result of a damaged cell.

EC9) The method of EC8, wherein the determining comprises applying forward error correction decoding to a sub-portion of the particular portion, the sub-portion comprising the at least one of the cells.

EC10) The method of EC8, wherein the error is a result of uni-directional shifts in device threshold voltage.

EC11) The method of EC10, wherein the uni-directional shifts comprise a specific uni-directional shift for lower pages.

EC12) The method of EC10, wherein the uni-directional shifts comprise two specific uni-directional shifts for upper pages.

EC13) The method of EC8, wherein the detecting comprises reprogramming and/or erasing at least a sub-portion of the particular portion and reading back the at least one of the cells, and the sub-portion comprises the at least one of the cells.

EC14) The method of EC13, wherein the reprogramming and/or erasing results in detecting a retention failure.

EC15) The method of EC8, wherein the detecting comprises detecting that the error is a result of other than retention failure.

EC16) The method of EC8, wherein the measuring further comprises updating one or more cell damage counters associated with any one or more of:
the at least one of the cells,
a sub-portion of the particular portion, the sub-portion comprising the at least one of the cells, and
the particular portion.

EC17) The method of EC16, wherein each sub-portion comprises a respective page.

EC18) The method of EC16, wherein the at least some results of the measuring comprise a value of the cell damage counter.

EC19) The method of EC16, wherein the performing comprises selecting ones of the portions to write based at least in part on values of the cell damage counters associated with the portions.

EC20) The method of EC19, wherein the cell damage counters are portion-specific cell damage counters, and at least a particular one of the values of the portion specific cell damage counters corresponding to a particular one of the portions is an aggregate of respective values of respective sub-portion specific cell damage counters of one or more sub-portions comprising the particular portion.

EC21) The method of EC19, wherein the selecting is further based upon a cell damage threshold.

EC22) The method of EC21, wherein the cell damage threshold is programmable.

EC23) The method of EC22, wherein the cell damage threshold is programmed to a first value at a first point in time and a second value different from the first value at a second point in time.

EC24) The method of EC1, wherein each portion comprises a respective block.

EC25) The method of EC1, wherein the NVM comprises one or more flash memories.

EC26) The method of EC1, further comprising operating a storage interface that is compatible with a storage interface standard to communicate information with a host, the information obtained at least in part from one or more locations of the NVM via operating a flash memory interface.

EC27) A tangible computer readable medium having a set of instructions stored therein that when executed by a processing element cause the processing element to perform and/or control operations comprising:
in a Non-Volatile Memory (NVM) comprising one or more portions, each portion comprising one or more cells, measuring cell damage for one or more of the cells; and
performing wear leveling on the portions, based at least in part upon at least some results of the measuring.

EC28) The tangible computer readable medium of EC27, wherein the cells are a particularly chosen subset.

EC29) The tangible computer readable medium of EC28, wherein the particularly chosen subset is a reserved subset.

EC30) The tangible computer readable medium of EC28, wherein the particularly chosen subset is physically different with respect to a complement of the particularly chosen subset.

EC31) The tangible computer readable medium of EC28, wherein the particularly chosen subset is an arbitrary subset of the NVM.

EC32) The tangible computer readable medium of EC27, wherein the measuring comprises detecting one or more of programming failure and erase failure.

EC33) The tangible computer readable medium of EC27, wherein the cell damage is a result of one or more of oxide trapping and oxide breakdown.

EC34) The tangible computer readable medium of EC27, wherein the measuring comprises:
   determining that an error reading from at least one of the cells of a particular one of the portions is a result of one or more of cell damage and cell leakage; and
   detecting that the error was a result of a damaged cell.

EC35) The tangible computer readable medium of EC34, wherein the determining comprises applying forward error correction decoding to a sub-portion of the particular portion, the sub-portion comprising the at least one of the cells.

EC36) The tangible computer readable medium of EC34, wherein the error is a result of uni-directional shifts in device threshold voltage.

EC37) The tangible computer readable medium of EC36, wherein the uni-directional shifts comprise a specific uni-directional shift for lower pages.

EC38) The tangible computer readable medium of EC36, wherein the uni-directional shifts comprise two specific uni-directional shifts for upper pages.

EC39) The tangible computer readable medium of EC34, wherein the detecting comprises reprogramming and/or erasing at least a sub-portion of the particular portion and reading back the at least one of the cells, and the sub-portion comprises the at least one of the cells.

EC40) The tangible computer readable medium of EC39, wherein the reprogramming and/or erasing results in detecting a retention failure.

EC41) The tangible computer readable medium of EC34, wherein the detecting comprises detecting that the error is a result of other than retention failure.

EC42) The tangible computer readable medium of EC34, wherein the measuring further comprises updating one or more cell damage counters associated with any one or more of:
   the at least one of the cells,
   a sub-portion of the particular portion, the sub-portion comprising the at least one of the cells, and
   the particular portion.

EC43) The tangible computer readable medium of EC42, wherein each sub-portion comprises a respective page.

EC44) The tangible computer readable medium of EC42, wherein the at least some results of the measuring comprise a value of the cell damage counter.

EC45) The tangible computer readable medium of EC42, wherein the performing comprises selecting ones of the portions to write based at least in part on values of the cell damage counters associated with the portions.

EC46) The tangible computer readable medium of EC45, wherein the cell damage counters are portion-specific cell damage counters, and at least a particular one of the values of the portion specific cell damage counters corresponding to a particular one of the portions is an aggregate of respective values of respective sub-portion specific cell damage counters of one or more sub-portions comprising the particular portion.

EC47) The tangible computer readable medium of EC45, wherein the selecting is further based upon a cell damage threshold.

EC48) The tangible computer readable medium of EC47, wherein the cell damage threshold is programmable.

EC49) The tangible computer readable medium of EC48, wherein the cell damage threshold is programmed to a first value at a first point in time and a second value different from the first value at a second point in time.

EC50) The tangible computer readable medium of EC27, wherein each portion comprises a respective block.

EC51) The tangible computer readable medium of EC27, wherein the NVM comprises one or more flash memories.

EC52) The tangible computer readable medium of EC27, wherein the operations further comprise operating a storage interface that is compatible with a storage interface standard to communicate information with a host, the information obtained at least in part from one or more locations of the NVM via operating a flash memory interface.

EC53) A system comprising:
   in a Non-Volatile Memory (NVM) comprising one or more portions, each portion comprising one or more cells;
   means for measuring cell damage for one or more of the cells; and
   means for performing wear leveling on the portions, based at least in part upon at least some results of the means for measuring.

EC54) The system of EC53, wherein the cells are a particularly chosen subset.

EC55) The system of EC54, wherein the particularly chosen subset is a reserved subset.

EC56) The system of EC54, wherein the particularly chosen subset is physically different with respect to a complement of the particularly chosen subset.

EC57) The system of EC54, wherein the particularly chosen subset is an arbitrary subset of the NVM.

EC58) The system of EC53, wherein the means for measuring comprises means for detecting one or more of programming failure and erase failure.

EC59) The system of EC53, wherein the cell damage is a result of one or more of oxide trapping and oxide breakdown.

EC60) The system of EC53, wherein the means for measuring comprises:
   means for determining that an error reading from at least one of the cells of a particular one of the portions is a result of one or more of cell damage and cell leakage; and
   means for detecting that the error was a result of a damaged cell.

EC61) The system of EC60, wherein the means for determining comprises means for applying forward error correction decoding to a sub-portion of the particular portion, the sub-portion comprising the at least one of the cells.

EC62) The system of EC60, wherein the error is a result of uni-directional shifts in device threshold voltage.

EC63) The system of EC62, wherein the uni-directional shifts comprise a specific uni-directional shift for lower pages.

EC64) The system of EC62, wherein the uni-directional shifts comprise two specific uni-directional shifts for upper pages.

EC65) The system of EC60, wherein the means for detecting comprises means for reprogramming and/or erasing at least a sub-portion of the particular portion and means for reading back the at least one of the cells, and the sub-portion comprises the at least one of the cells.

EC66) The system of EC65, wherein operating the means for reprogramming and/or erasing results in detecting a retention failure.

EC67) The system of EC60, wherein the means for detecting comprises means for detecting that the error is a result of other than retention failure.

EC68) The system of EC60, wherein the means for measuring further comprises means for updating one or more cell damage counters associated with any one or more of:
the at least one of the cells,
a sub-portion of the particular portion, the sub-portion comprising the at least one of the cells, and
the particular portion.

EC69) The system of EC68, wherein each sub-portion comprises a respective page.

EC70) The system of EC68, wherein the at least some results of the means for measuring comprise a value of the cell damage counter.

EC71) The system of EC68, wherein the means for performing comprises means for selecting ones of the portions to write based at least in part on values of the cell damage counters associated with the portions.

EC72) The system of EC71, wherein the cell damage counters are portion-specific cell damage counters, and at least a particular one of the values of the portion specific cell damage counters corresponding to a particular one of the portions is an aggregate of respective values of respective sub-portion specific cell damage counters of one or more sub-portions comprising the particular portion.

EC73) The system of EC71, wherein the means for selecting is further based upon a cell damage threshold.

EC74) The system of EC73, wherein the cell damage threshold is programmable.

EC75) The system of EC74, wherein the cell damage threshold is programmed to a first value at a first point in time and a second value different from the first value at a second point in time.

EC76) The system of EC53, wherein each portion comprises a respective block.

EC77) The system of EC53, wherein the NVM comprises one or more flash memories.

EC78) The system of EC53, further comprising means for operating a storage interface that is compatible with a storage interface standard to communicate information with a host, the information obtained at least in part from one or more locations of the NVM via operating a flash memory interface.

EC79) An apparatus comprising:
a Non-Volatile Memory (NVM) comprising one or more portions; each portion comprising one or more cells;
measurement hardware logic circuitry enabled to measure cell damage for one or more of the cells; and
wear level hardware logic circuitry enabled to perform wear leveling on the portions, based at least in part upon at least some results of the measurement hardware logic circuitry.

EC80) The apparatus of EC79, wherein the cells are a particularly chosen subset.

EC81) The apparatus of EC80, wherein the particularly chosen subset is a reserved subset.

EC82) The apparatus of EC80, wherein the particularly chosen subset is physically different with respect to a complement of the particularly chosen subset.

EC83) The apparatus of EC80, wherein the particularly chosen subset is an arbitrary subset of the NVM.

EC84) The apparatus of EC79, wherein the measurement hardware logic circuitry comprises failure detection hardware logic circuitry enabled to detect one or more of programming failure and erase failure.

EC85) The apparatus of EC79, wherein the cell damage is a result of one or more of oxide trapping and oxide breakdown.

EC86) The apparatus of EC79, wherein the measurement hardware logic circuitry comprises:
determination hardware logic circuitry enabled to determine that an error reading from at least one of the cells of a particular one of the portions is a result of one or more of cell damage and cell leakage; and
damage detection hardware logic circuitry enabled to detect that the error was a result of a damaged cell.

EC87) The apparatus of EC86, wherein the determination hardware logic circuitry comprises decode hardware logic circuitry enabled to apply forward error correction decoding to a sub-portion of the particular portion, the sub-portion comprising the at least one of the cells.

EC88) The apparatus of EC86, wherein the error is a result of uni-directional shifts in device threshold voltage.

EC89) The apparatus of EC88, wherein the uni-directional shifts comprise a specific uni-directional shift for lower pages.

EC90) The apparatus of EC88, wherein the uni-directional shifts comprise two specific uni-directional shifts for upper pages.

EC91) The apparatus of EC86, wherein the damage detection hardware logic circuitry comprises retry hardware logic circuitry enabled to reprogram and/or erase at least a sub-portion of the particular portion and read back the at least one of the cells, and the sub-portion comprises the at least one of the cells.

EC92) The apparatus of EC91, wherein the retry hardware logic circuitry is further enabled to detect a retention failure.

EC93) The apparatus of EC86, wherein the damage detection hardware logic circuitry is enabled to detect that the error is a result of other than retention failure.

EC94) The apparatus of EC86, wherein the measurement hardware logic circuitry further comprises counter hardware logic circuitry enabled to update one or more cell damage counters associated with any one or more of:
the at least one of the cells,
a sub-portion of the particular portion, the sub-portion comprising the at least one of the cells, and
the particular portion.

EC95) The apparatus of EC94, wherein each sub-portion comprises a respective page.

EC96) The apparatus of EC94, wherein the at least some results of the measurement hardware logic circuitry comprise a value of the cell damage counter.

EC97) The apparatus of EC94, wherein the wear level hardware logic circuitry comprises selection hardware logic circuitry enabled to select ones of the portions to write based at least in part on values of the cell damage counters associated with the portions.

EC98) The apparatus of EC97, wherein the cell damage counters are portion-specific cell damage counters, and at least a particular one of the values of the portion specific cell damage counters corresponding to a particular one of the portions is an aggregate of respective values of respective sub-portion specific cell damage counters of one or more sub-portions comprising the particular portion.

EC99) The apparatus of EC97, wherein the selection hardware logic circuitry is further enabled to select based upon a cell damage threshold.

EC100) The apparatus of EC99, wherein the cell damage threshold is programmable.

EC101) The apparatus of EC100, wherein the cell damage threshold is programmed to a first value at a first point in time and a second value different from the first value at a second point in time.

EC102) The apparatus of EC79, wherein each portion comprises a respective block.

EC103) The apparatus of EC79, wherein the NVM comprises one or more flash memories.

EC104) The apparatus of EC79, further comprising a storage interface that is compatible with a storage interface standard and enabled to communicate information with a host, the information obtained at least in part from one or more locations of the NVM via operating a flash memory interface comprised in the apparatus.

EC105) Any of the foregoing ECs having or referring to a storage interface standard, wherein the storage interface standard comprises one or more of
    a Universal Serial Bus (USB) interface standard,
    a Compact Flash (CF) interface standard,
    a MultiMediaCard (MMC) interface standard,
    an embedded MMC (eMMC) interface standard,
    a Thunderbolt interface standard,
    a UFS interface standard,
    a Secure Digital (SD) interface standard,
    a Memory Stick interface standard,
    an xD-picture card interface standard,
    an Integrated Drive Electronics (IDE) interface standard,
    a Serial Advanced Technology Attachment (SATA) interface standard,
    an external SATA (eSATA) interface standard,
    a Small Computer System Interface (SCSI) interface standard,
    a Serial Attached Small Computer System Interface (SAS) interface standard,
    a Fibre Channel interface standard,
    an Ethernet interface standard, and
    a Peripheral Component Interconnect express (PCIe) interface standard.

EC106) Any of the foregoing ECs having or referring to a flash memory interface, wherein the flash memory interface is compatible with one or more of
    an Open NAND Flash Interface (ONFI),
    a Toggle-mode interface,
    a Double-Data-Rate (DDR) synchronous interface,
    a DDR2 synchronous interface;
    a synchronous interface, and
    an asynchronous interface.

EC107) Any of the foregoing ECs having or referring to a host, wherein the host comprises one or more of
    a computer,
    a workstation computer,
    a server computer,
    a storage server,
    a Storage Attached Network (SAN),
    a Network Attached Storage (NAS) device,
    a Direct Attached Storage (DAS) device,
    a storage appliance,
    a Personal Computer (PC),
    a laptop computer,
    a notebook computer,
    a netbook computer,
    a tablet device or computer,
    an ultrabook computer,
    an electronic reading device (an e-reader),
    a Personal Digital Assistant (PDA),
    a navigation system,
    a (handheld) Global Positioning System (GPS) device,
    an automotive control system,
    an automotive media control system or computer,
    a printer, copier or fax machine or all-in-one device,
    a Point Of Sale (POS) device,
    a cash-register,
    a media player,
    a television,
    a media recorder,
    a Digital Video Recorder (DVR),
    a digital camera,
    a cellular handset,
    a cordless telephone handset, and
    an electronic game.

EC108) Any of the foregoing ECs having or referring to at least one flash memory, wherein at least a portion of the at least one flash memory comprises one or more of
    NAND flash technology storage cells, and
    NOR flash technology storage cells.

EC109) Any of the foregoing ECs having or referring to at least one flash memory, wherein at least a portion of the at least one flash memory comprises one or more of
    Single-Level Cell (SLC) flash technology storage cells, and
    Multi-Level Cell (MLC) flash technology storage cells.

EC110) Any of the foregoing ECs having or referring to at least one flash memory, wherein at least a portion of the at least one flash memory comprises one or more of
    polysilicon technology-based charge storage cells, and
    silicon nitride technology-based charge storage cells.

EC111) Any of the foregoing ECs having or referring to at least one flash memory, wherein at least a portion of the at least one flash memory comprises one or more of
    two-dimensional technology-based flash memory technology, and
    three-dimensional technology-based flash memory technology.

System

In some embodiments, an I/O device, such as an SSD, includes an SSD controller. The SSD controller acts as a bridge between the host interface and NVM of the SSD, and executes commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses in the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

In some embodiments, accessing compressed data of varying-sized quanta in NVM provides improved storage efficiency in some usage scenarios. For example, an SSD controller receives (uncompressed) data from a computing host (e.g., relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variants thereof).

In various embodiments, an SSD controller includes a host interface for interfacing with a computing host, an interface for interfacing with NVM such as flash memory, and circuitry for controlling the interfaces and performing (and/or controlling various aspects of the performing) compressing and uncompressing, as well as lower-level redundancy and/or error correction, higher-level redundancy and/or error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as a SAS/SATA bridge) operates as a computing host and/or as a bridge to a computing host.

In various embodiments, the SSD controller includes one or more processors. The processors execute firmware to control and/or perform operation of the SSD controller. The SSD controller communicates with the computing host to send and receive commands and/or status as well as data. The computing host executes one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example, a PCIe SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

FIG. 1A illustrates selected details of SSD 101 including SSD Controller 100 that measures cell damage for wear leveling of Non-Volatile Memory (NVM) elements (e.g., flash memories). SSD Controller 100 is communicatively coupled via one or more External Interfaces 110 to a host (not illustrated) such as host 102 of FIG. 1B. According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more instances of Flash Device 192. According to various embodiments, Device Interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each of Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash Device 192 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, Device Interfaces 190 are organized as: one or more busses with one or more instances of Flash Device 192 per bus; one or more groups of busses with one or more instances of Flash Device 192 per bus, having busses in a group generally accessed in parallel; or any other organization of one or more instances of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161, Device Interface Logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the commands include a read command specifying an address (such as an LBA) and an amount of data (such as a number of LBA quanta, e.g., sectors) to read; in response the SSD provides read status and/or read data. For another example, the commands include a write command specifying an address (such as an LBA) and an amount of data (such as a number of LBA quanta, e.g., sectors) to write; in response the SSD provides write status and/or requests write data and optionally subsequently provides write status. For yet another example, the commands include a de-allocation command (e.g. a trim command) specifying one or more addresses (such as one or more LBAs) that no longer need be allocated; in response the SSD modifies the Map accordingly and optionally provides de-allocation status. In some contexts an ATA compatible TRIM command is an exemplary de-allocation command. For yet another example, the commands include a super capacitor test command or a data hardening success query; in response, the SSD provides appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 and External Interfaces 110; and Data Processing 121 optionally and/or selectively processes data stored in Buffer 131. In some embodiments, Data Processing 121 uses one or more Engines 123 to perform one or more of: formatting; reformatting; transcoding; and any other data processing and/or manipulation task.

Buffer 131 stores data sent to/from External Interfaces 110 from/to Device Interfaces 190. In some embodiments, Buffer 131 additionally stores system data, such as some or all map tables, used by SSD Controller 100 to manage one or more instances of Flash Device 192. In various embodiments, Buffer 131 has one or more of: Memory 137 used for temporary storage of data; DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability (e.g. RASIE), with redundancy at a flash device level (e.g., multiple ones of Flash Device 192) and/or a flash die level (e.g., Flash Die 194) instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 161 is used to provide lower-level error correction and/or redundancy functions, such as in accordance with one or more ECC techniques. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash Device 192 according to a protocol of Flash Device 192. Device Interface Logic 191 includes Scheduling 193 to selectively sequence control of the instances of Flash Device 192 via Device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Die 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocation, the Map points to a default value to return if the LBAs are read. For example, when processing a de-allocation command, the Map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command and/or primitive arguments and/or parameters, programmable registers, or various combinations thereof.

In some embodiments, Map 141 uses Table 143 to perform and/or to look up translations between addresses used on External Interfaces 110 and data addressing used on Device Interfaces 190. According to various embodiments, Table 143 is one or more of: a one-level map; a two-level map; a multi-level map; a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writeable. Recycler 151 is enabled to determine which portions of the instances of Flash Device 192 are actively in use (e.g., allocated instead of de-allocated), such as by scanning a map maintained by Map 141, and to make unused (e.g., de-allocated) portions of the instances of Flash Device 192 available for writing by erasing the unused portions. In further embodiments, Recycler 151 is enabled to move data stored within instances of Flash Device 192 to make larger contiguous portions of the instances of Flash Device 192 available for writing.

In some embodiments, instances of Flash Device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD Controller 100. CPU 171 includes CPU Core 172. CPU Core 172 is, according to various embodiments, one or more single-core or multi-core processors. The individual processors cores in CPU Core 172 are, in some embodiments, multi-threaded. CPU Core 172 includes instruction and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash Device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identity Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include one or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of a multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
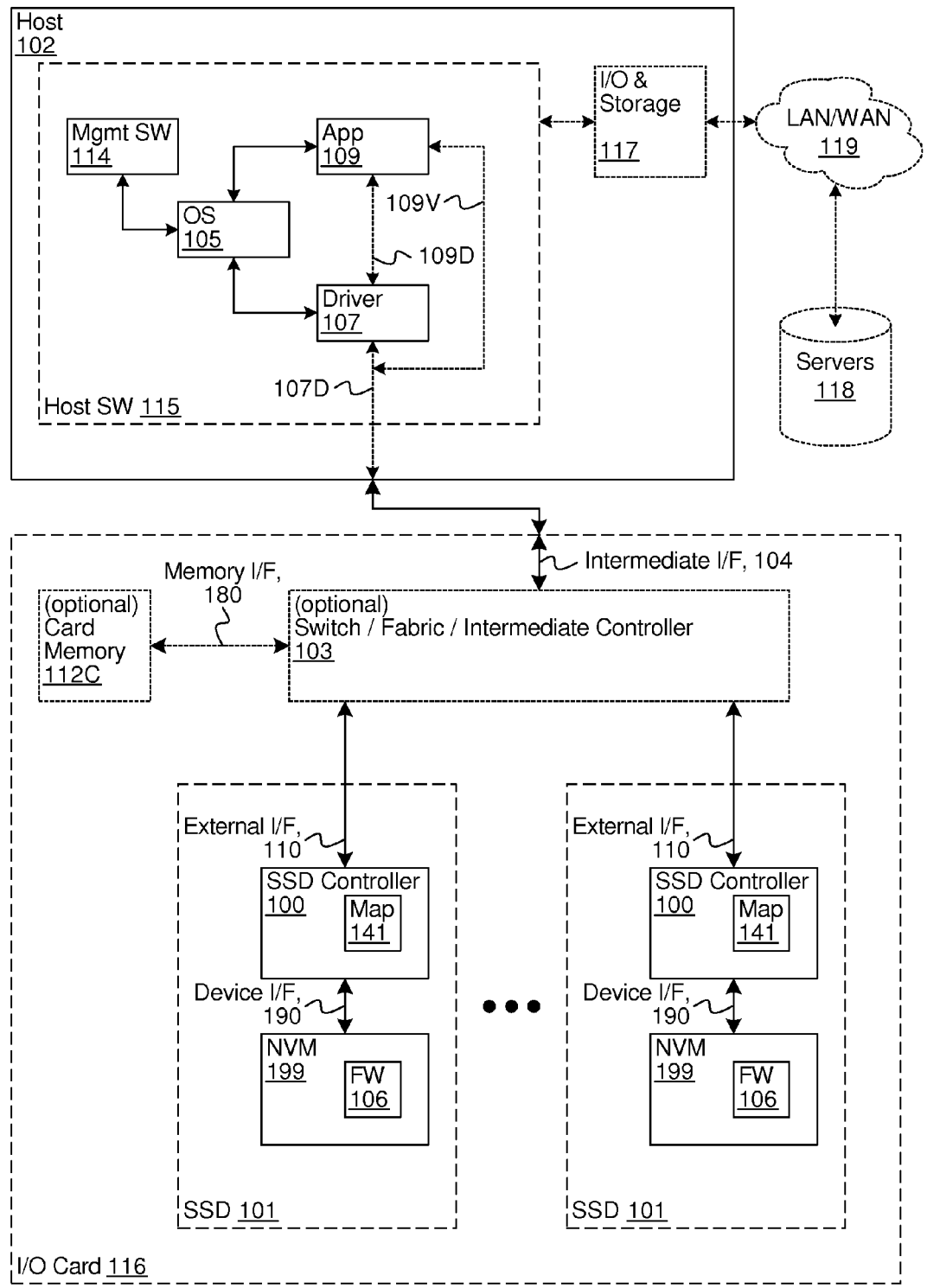
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various classes of embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 101 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to Host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variations thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software ←→ I/O Device Communication, e.g. data sent/received to/from one or more of the instances of SSD 101 and from/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linux (e.g. Red Hat, Debian, and Ubuntu), and various versions of MacOS (e.g. 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints);

use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of Application ←→ I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application ←→ I/O Device Communication (e.g. bypass via a VF for an application), e.g. a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 100. A firmware image has, for another example, one or more images of constants, parameter values, and NVM device information, referenced, e.g. by the CPU core during the firmware execution. The images of firmware correspond, e.g., to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the Host directly via External Interfaces 110. In various embodiments, SSD Controller 100 is coupled to the Host via one or more intermediate levels of other controllers, such as a RAID controller. In some embodiments, SSD 101 (or variations thereof) corresponds to a SAS drive or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments with Host 102 as a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage Devices/Resources 117 and optional LAN/WAN 119) with one or more local and/or remote servers (e.g. optional Servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a Memory Stick storage component, and an xD-picture card storage component.

In various embodiments, all or any portions of an SSD controller (or a computing-host flash memory controller), or functions thereof, are implemented in a host that the controller is to be coupled with (e.g., Host 102 of FIG. 1B). In various embodiments, all or any portions of an SSD controller (or a computing-host flash memory controller), or functions thereof, are implemented via hardware (e.g., logic circuitry), software and/or firmware (e.g., driver software and/or SSD control firmware), or any combination thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to Recycler 151 of FIG. 1A) is implemented partially via software on a host and partially via hardware in a computing-host flash memory controller.

Cell Damage Measurement

Figure 2A:
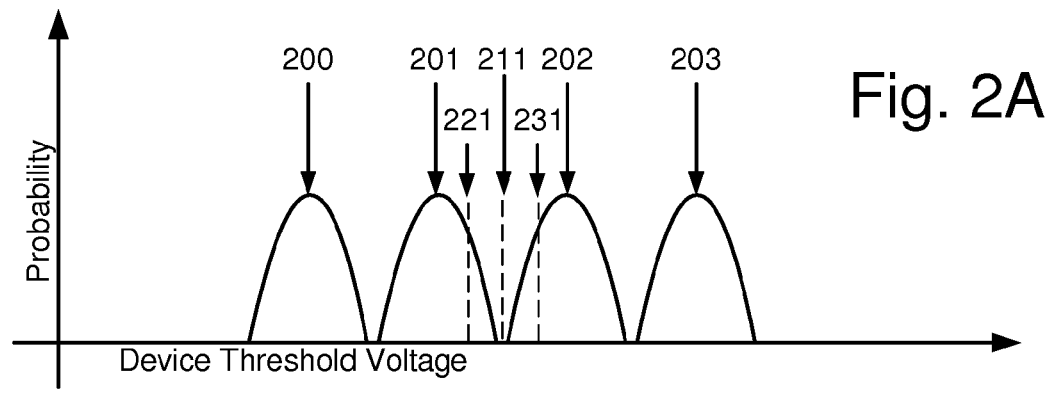
FIGS. 2A and 2B conceptually illustrate device threshold voltage distributions relevant to cell damage measurement.
Figure 2B:
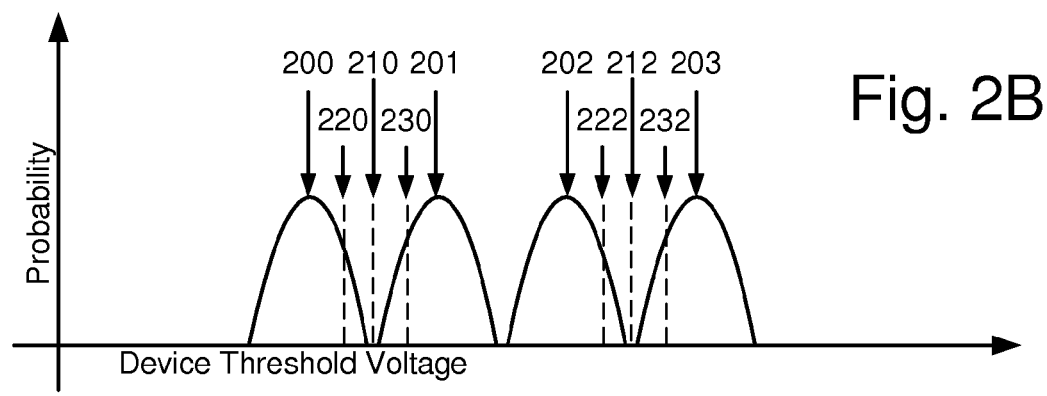

FIGS. 2A and 2B conceptually illustrate device threshold voltage distributions relevant to cell damage measurement. For the purposes of this discussion, each hill-like bump is an abstraction for an independent Gaussian-like curve representing a device threshold voltage probability distribution for a respective state of a read unit sized portion of an NVM. The device threshold voltage axis is drawn with increasing positive voltage to the right. An absolute scale is purposefully not provided, and no reference points are identified, such that the plots apply more generally to a larger population of NVMs. FIGS. 2A and 2B conceptually illustrate a 4LC memory that stores two bits per cell with a particular encoding scheme. There are four threshold voltage distributions, (E 200, D1 201, D2 202, and D3 203) that encode four states (respectively 11, 01, 00, 10).

FIG. 2A is lower page specific, while FIG. 2B is upper page specific. Cells to the left of MLC Lower Page Threshold 211 have a lower page value of "1", while cells to the right of MLC Lower Page Threshold have a lower page value of "0". In various embodiments and/or usage scenarios, cell error is caused by voltage overshoot during programming. In the illustrated encoding scheme, cell error causes a cell to unidirectionally shift from MLC Lower Page State 221 to Shifted MLC Lower Page State 231 and change from a value of "1" (e.g. D1) to a value of "0" (e.g. D2). For the encoding illustrated in FIG. 2A, a lower page retention error will cause a shift in the reverse direction (e.g. from D2 to D1), as charge leaks from the cell.

In FIG. 2B, cells to the left of MLC Upper Page First Threshold 210 and cells to the right of MLC Upper Page Second Threshold 212 have an upper page value of "1". Cells between the MLC First Upper Page Threshold and the MLC Second Upper Page Threshold have a value of "0". In this encoding scheme, cell error also causes uni-directional shifts in device threshold voltage. For example, cell error causes MLC Upper Page First State 220 to uni-directionally shift to Shifted MLC Upper Page First State 230 and change from a value of "1" (E) to a value of "0" (D1). Cell error causes MLC Upper Page Second State 222 to uni-directionally shift to Shifted MLC Upper Page Second State 232 and change from a value of "0" (D2) to a value of "1" (D3). For the encoding illustrated in FIG. 2B, upper page retention errors will respectively cause uni-directional shifts in the reverse direction (e.g. from D1 to E, or from D3 to D2).

Cell damage manifests in a variety of ways, including failure for cells to fully erase (not returning fully to E 200 upon erasure), failure to properly program (not reaching or over-shooting a determined one of D1 201, D2 202, and D3 203 upon programming), inability to maintain charge (e.g., excessive leakage), physical failures (such as shorts or opens), and other causes.

Functions for Cell Damage Measurement

Figure 3:
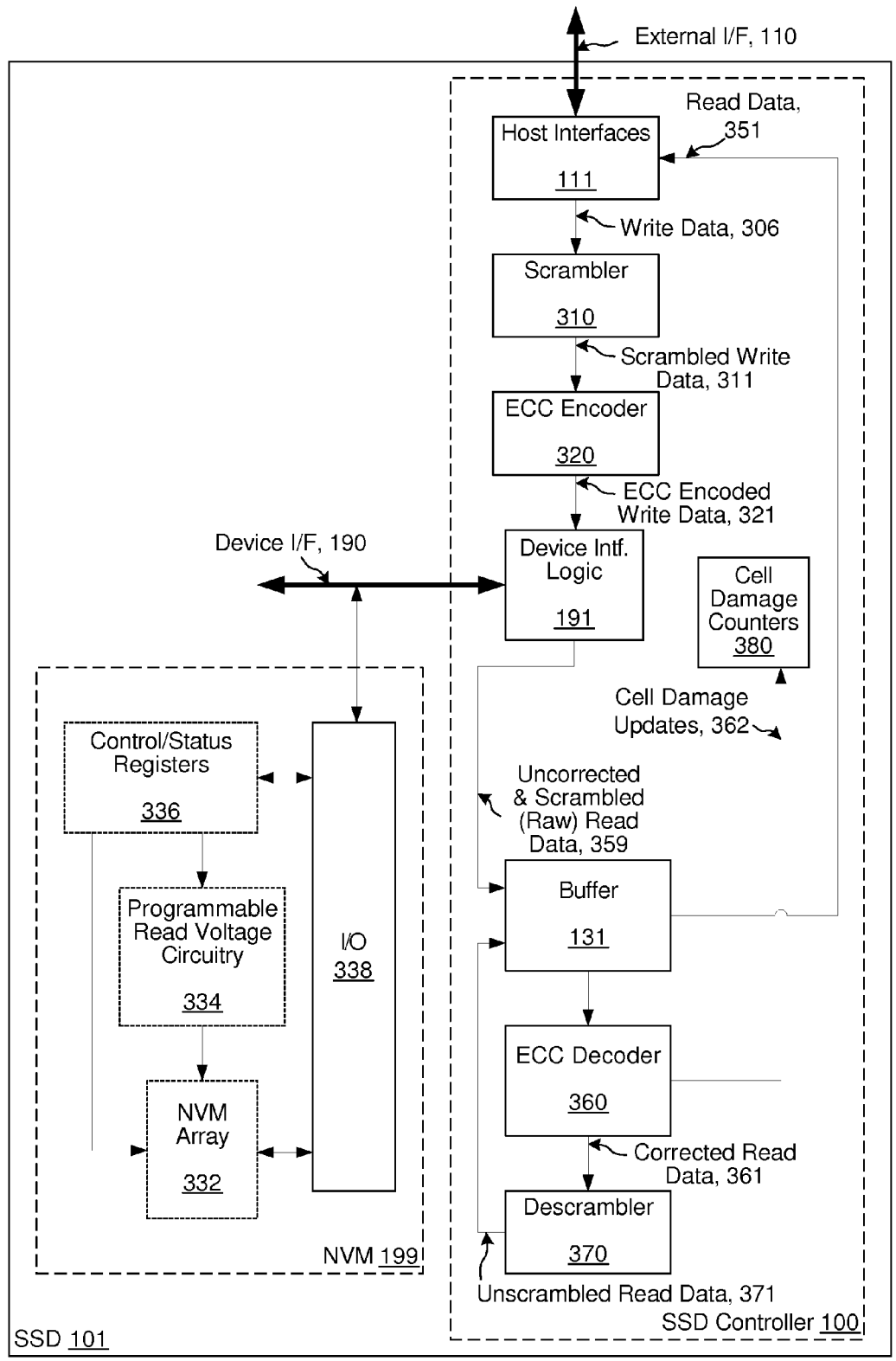
FIG. 3 illustrates selected details of a system embodiment of an instance of the SSD of FIG. 1A, providing particular details regarding measuring cell damage for wear leveling in an NVM.

FIG. 3 provides alternate views of SSD 101, SSD Controller 100, and NVM 199 of FIGS. 1A and 1B, redrawing selected logic block boundaries to emphasize particular functions. SSD 101 at the top level includes External Interfaces 110, SSD Controller 100, NVM 199, and Device Interfaces 190.

External Interfaces 110 is coupled to a host, such as Host 102 of FIG. 1B, and supports a high-level storage protocol such as SATA, including host-sourced storage-related commands and write-data and controller-sourced read-data, and as detailed in the above discussion of FIG. 1A. Device Interfaces 190 supports low-level NVM I/O transactions, as detailed in the discussion of FIG. 1A. NVM 199 includes NVM Array 332, Programmable Read Voltage Circuitry 334, Control/Status Registers 336, and I/O 338. SSD Controller 100 features Host Interfaces 111, Scrambler 310, ECC Encoder 320, Device Interface Logic 191, Buffer 131, ECC Decoder 360, Descrambler 370, and Cell Damage Counters 380. Host Interfaces 111 couples with the Host via External Interfaces 110 as discussed previously, provides Write Data 306 to Scrambler 310, and receives Read Data 351 from Buffer 131.

The write path and functionality are as follows. Scrambler 310 operates on Write Data 306 to generate Scrambled Write Data 311 to ECC Encoder 320. Scrambler 310 scrambles Write Data 306 in a reversible manner and such that Scrambled Write Data 311 has a known statistical distribution of states stored. An example of a block including scrambled data is a block containing Scrambled Write Data 311. E.g. an SLC block including scrambled data contains a statistically equal number of '0' and '1' values and a 4LC block including scrambled data contains a statistically equal number of '00', '01', '10', and '11' states. Statistically equal means that when averaged over a large number of samples, the results would be equivalent to what would be expected with an even distribution of the states. For example, flipping a coin 1 million times results in a statistically equal number of heads and tails, though the actual number of heads and tails in any one sample is possibly not numerically equal.

In some embodiments, Scrambler 310 performs encryption, such as via an AES encoder that randomizes the data as a by-product of encryption. In some embodiments, Scrambler 310 uses a Linear Feedback Shift Register (LFSR) to randomize the data (but without any data security intent). ECC Encoder 320 processes Scrambled Write Data 311 to add additional ECC bits, resulting in ECC Encoded Write Data 321 that is provided to Device Interface Logic 191 for storing into NVM 199 via Device Interfaces 190.

The basic read path and functionality are as follows. NVM pages, including Uncorrected and Scrambled (Raw) Read Data 359, are received from NVM 199 via Device Interfaces 190. Continuing with respect to FIG. 3, each read unit nominally includes the data scrambled by Scrambler 301 as well as the additional ECC bits generated by ECC Encoder 320, but as generally unintentionally altered as a result of NVM storage and retrieval operations. The read units are provided to ECC Decoder 360 via Buffer 131. ECC Decoder 360 processes the read units, exploiting the included additional ECC bits to generally correct any errors that may have arisen at any point and time since the data was first ECC encoded, resulting in Corrected Read Data 361 that is provided to Descrambler 370. Descrambler 370 operates on Corrected Read Data 361, reversing the scrambling performed by Scrambler 310, resulting in Unscrambled Read Data 371 that is provided as Read Data 351 to Host Interfaces 111 via Buffer 131.

In various embodiments, Cell Damage Counters 380 interact with the read path and the write path to track cell damage of pages and/or blocks of NVM. Specifically, when the SSD Controller detects that an error was caused by cell damage, the ECC Decoder sends Cell Damage Updates 362 to update one or more values of the Cell Damage Counters. In some embodiments, writes are directed to blocks of NVM at least in part based upon one or more values of the Cell Damage Counters. In various embodiments, the values of the Cell Damage Counters track a number of damaged cells in one or more of pages of NVM and/or blocks of NVM. In some embodiments, the values of the Cell Damage Counters track the number of damaged cells in a block of NVM by summing the number of damaged cells in the pages of NVM that the block includes.

FIG. 3 illustrates functions for cell damage measurement in a context where a host operates as a source and a sink for data written to and read from NVM 199. In various embodiments (such as illustrated by FIG. 1A and FIG. 1B), one or more other agents operate as sources and sinks for data written to and read from NVM 199. An example of the other agents is Recycler 151 of FIG. 1A, that moves data from one location to another in NVM 199, as described elsewhere herein.

In various embodiments, any or all portions of functionality associated with any one or more of Scrambler 310, ECC Encoder 320, ECC Decoder 360, and Descrambler 370 are implemented at least in part using one or more of Data Processing 121 and ECC 161 (both of FIG. 1A).

Control Flows for Measurement of Cell Damage

Figure 4:
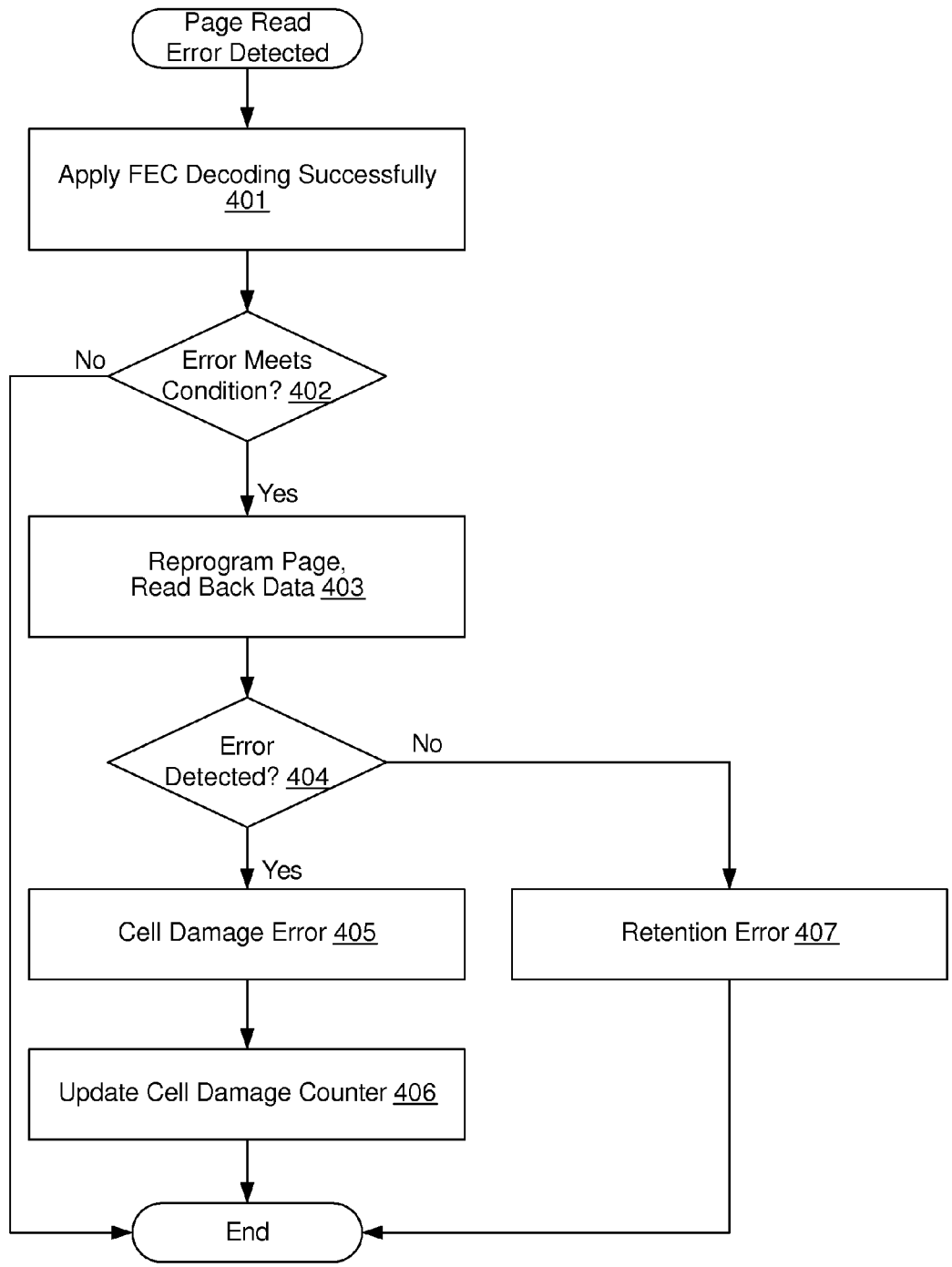
FIG. 4 illustrates selected control flow details for an embodiment of the SSD of FIGS. 1A, 1B, and 3, providing particular details regarding measurement of cell damage.

FIG. 4 illustrates selected control flow details for an embodiment of the SSD of FIGS. 1A, 1B, and 3, providing particular details regarding measurement of cell damage. The discussion focuses on measuring cell damage to lower pages of NVM. However, other embodiments are contemplated that measure cell damage to any (e.g. upper) pages of NVM.

In some scenarios, an error occurs when reading a page of NVM. When a page read error is detected, the SSD Controller applies FEC decoding (e.g. ECC Decoding or LDPC Decoding by ECC Decoder) to correct the error. Once the FEC decoding is successful 401, the type of error is determined. If the error meets a condition 402, then the error may have been caused by cell damage. In some embodiments, the condition is that all incorrect cells in the page were uni-directionally shifted from the correct value (e.g. all incorrect cells were shifted from "1" to "0"). In other embodiments, the condition is that a majority of the incorrect cells in the page were uni-directionally shifted from the correct values (e.g. greater than 50% of the incorrect cells were shifted from "1" to "0").

In yet other embodiments, the condition is that at least one of the incorrect cells in the page was uni-directionally shifted from the correct value (e.g. one of the incorrect cells was shifted from "1" to "0"). In still other embodiments, the condition is that a number of the incorrect cells and/or a number of the incorrect cells shifted in a specified direction from the correct value exceeds a threshold, the threshold based at least in part on a duration since the page was programmed.

If the error does not meet the condition, then processing ends. If the error does meet the condition, then in some scenarios the error was caused by either cell damage or retention. To detect whether the error was caused by cell damage, the page is erased and/or reprogrammed and immediately read back 403. During the read back, the ECC Decoder will detect any subsequent errors 404. If no subsequent errors are detected (e.g. if erasing and/or reprogramming the page fixes the error), the page read error was caused by a retention failure 407 (e.g. due to cell leakage) and processing ends because no cell damage has been detected.

However, if a subsequent error is detected (e.g. by the ECC Decoder) during the read back, the subsequent error indicates that the page read error was a Cell Damage Error 405. The Cell Damage Error is recorded, using the Cell Damage Counters. The value(s) of the Cell Damage Counters associated with the page and/or the block of NVM having the subsequent error is updated 406. In some embodiments, the value of the Cell Damage Counters associated with the page and/or the block of NVM is incremented by the number of damaged cells (e.g. if four cells in the page/block are damaged, the associated counter is incremented by four). Once the Cell Damage Counters have been updated, the cell damage measurement is complete. In some embodiments, one or more locations of the damaged cells are tracked so that repeated errors in the one or more locations do not cause repeated incrementing of the Cell Damage Counters.

Cell Damage Measurements and Wear Leveling

In some embodiments and/or usage scenarios, wear leveling techniques improve reliability, lifetime and/or performance of NVM by reducing cell damage. In some embodiments, wear leveling evenly distributes P/E cycles across blocks of the NVM to avoid prematurely wearing out (e.g. causing cell damage to) any one of the individual blocks.

However, the number of P/E cycles for a block of NVM is an imperfect estimate of cell damage. Many other factors (e.g. PVT or dwell time) influence cell damage and are non-uniform across an NVM and/or an SSD. As a result, two blocks of NVM at different temperatures might fail (e.g. due to cell damage) at very different P/E cycle counts. In various embodiments and/or usage scenarios, measuring cell damage enables more accurate wear leveling (e.g. by accounting implicitly for variations in temperature between blocks and/or dies of NVM).

Figure 5:
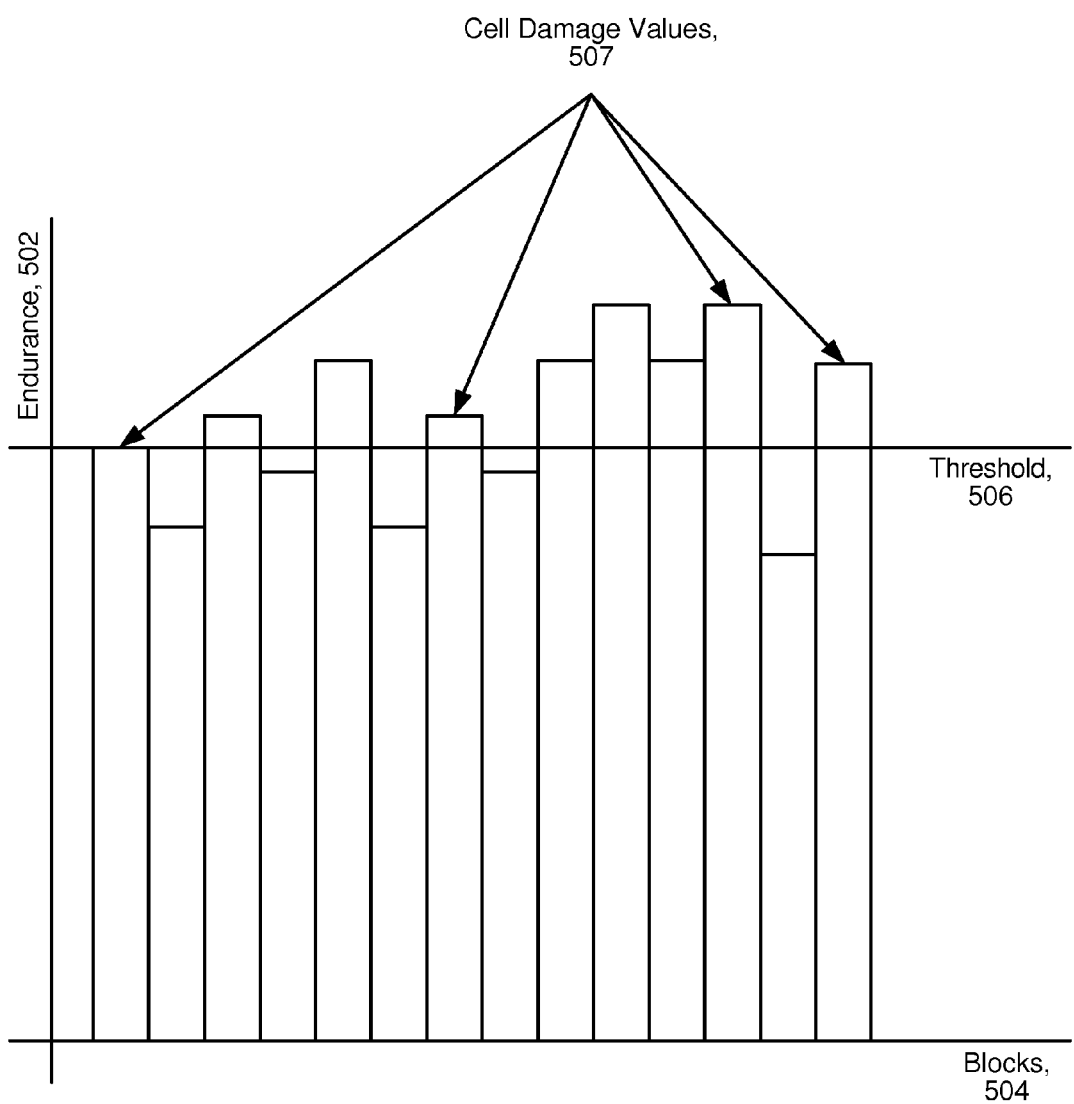
FIG. 5 conceptually illustrates selected details of wear leveling based upon measured cell damage.

FIG. 5 conceptually illustrates selected details of wear leveling based upon measured cell damage. Endurance 502 of Blocks of NVM 504 is monitored. Rather than measure endurance as a number of P/E cycles, each of the bars in FIG. 5 represent Cell Damage Values 507 of the Cell Damage Counters for a respective one of Blocks of NVM 504. Thus Endurance 502 corresponds to the actual wear of the blocks, rather than the P/E cycles of the Blocks.

In various embodiments, Cell Damage Threshold 506 is used to optimize wear leveling. Blocks where the value of the Cell Damage Counter exceeds the cell damage threshold are at a higher risk for failure and are written less frequently, such as by being used to store data that is known or more likely to be written less often. Blocks where the value of the Cell Damage Counter does not exceed the cell damage threshold are a lower risk for failure and are written more frequently, such as by being used to store data that is known or more likely to be written more often. In various embodiments, the cell damage threshold is programmable and is adjusted over time. By selecting blocks with less cell damage more frequently, the wear leveling technique equalizes the cell damage across all blocks, thereby reducing the likelihood of a failure and increasing performance and/or reliability.

Other Embodiment Information

In various embodiments, one or more operations (or portions thereof) illustrated in FIG. 4 is performed by and/or managed by an SSD controller (such as SSD Controller 100 of FIG. 1A) or elements thereof. For example, in some embodiments, one or more operations illustrated in FIG. 4 are implemented by and/or managed by firmware executed by CPU Core 172 of FIG. 1A. In various embodiments, one or more operations (or portions thereof) illustrated in FIG. 4 are performed by and/or managed by any one or more elements illustrated in FIG. 3. For example, in some embodiments, detection of a subsequent error (e.g. as performed by some embodiments of Error Detected? 404) is performed at least in part by ECC Decoder 360 of FIG. 3.

Example Implementation Techniques

In some embodiments, various combinations of all or portions of operations performed by an SSD measuring cell damage for wear leveling in a non-volatile memory, e.g., with flash memories, a computing-host flash memory controller, and/or an SSD controller (such as SSD Controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, or portions thereof.

CONCLUSION

Certain choices have been made in the description merely for convenience in preparing the text and drawings, and unless there is an indication to the contrary, the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
in a Non-Volatile Memory (NVM) comprising one or more portions, each of the one or more portions comprising one or more cells, detecting an initial error from at least one or more cells of a particular one of the one or more portions;
determining whether the initial error a particular error condition;
responsive to determining that the initial error is the particular error condition, reprogramming at least a sub-portion of the particular portion and reading back the at least one of the cells, the sub-portion comprising the at least one of the cells;
detecting whether the at least one of the cells reprogrammed and read back includes a subsequent error; and
responsive to detecting whether the at least one of the cells includes a subsequent error, recording that the particular error condition is a first type of error condition.

2. The method of claim 1, wherein the first type of error is one or more of programming failure and erase failure.

3. The method of claim 1, wherein the determining comprises applying forward error correction decoding to a sub-portion of the particular portion, the sub-portion comprising the at least one of the cells.

4. The method of claim 1, wherein the detecting of the subsequent error comprises reprogramming and/or erasing at least a sub-portion of the particular portion and reading back the at least one of the cells, the sub-portion comprising the at least one of the cells.

5. The method of claim 1, further comprising:
detecting that the first type of error condition is a cell damage error;
measuring cell damage for the one or more of the cells; and
performing wear leveling on the one or more portions, based at least in part upon at least some results of the measuring, wherein the recording the particular error condition as the first type of error condition further comprises updating one or more cell damage counters associated with any one or more of:
the at least one of the cells,
a sub-portion of the particular portion, the sub-portion comprising the at least one of the cells, and
the particular portion.

6. The method of claim 5, wherein the performing comprises selecting ones of the portions to write based at least in part on values of the cell damage counters associated with the portions.

7. A system comprising:
a Non-Volatile Memory (NVM) comprising one or more portions, each of the one or more portions comprising one or more cells; and
a controller enabled to
detect an initial error from at least one or more cells of a particular one of the one or more cells,
determine whether the initial error from at least one of the one or more cells of a particular one of the one or more portions is a particular error condition,
responsive to determining that the initial error is the particular error condition, reprogram at least a sub-portion of the particular portion and read back the at least one of the cells, the sub-portion comprising the at least one of the cells,
detect whether the at least one of the cells reprogrammed and read back includes a subsequent error, and
responsive to detecting whether the at least one of the cells includes a subsequent error, record that the particular error condition is a first type of error condition.

8. The system of claim 7, wherein the first type of error condition is one or more of programming failure and erase failure.

9. The system of claim 7, wherein the controller is further enabled to apply forward error correction decoding to a sub-portion of the particular portion, the sub-portion comprising the at least one of the cells.

10. The system of claim 7, wherein the controller is further enabled to:
record that the first type of error condition is a cell damage error,
measure cell damage for the one or more of the cells, and
perform wear leveling on the one or more portions, based at least in part upon at least some results of the measuring cell damage, and
update one or more cell damage counters associated with any one or more of:
the at least one of the cells,
a sub-portion of the particular portion, the sub-portion comprising the at least one of the cells, and
the particular portion.

11. The system of claim 10, wherein the controller is further enabled to select ones of the portions to write based at least in part on values of the cell damage counters associated with the portions.

12. An apparatus comprising:
a Non-Volatile Memory (NVM) comprising one or more portions; each of the one or more portions comprising one or more cells;
measurement hardware logic circuitry enabled to detect an initial error for one or more of the cells, and determine whether the initial error from at least one of the one or more cells of a particular one of one or more portions is a particular error condition;
retry hardware logic circuitry enabled to reprogram at least a sub-portion of the particular portion and read back the at least one of the cells responsive to the determination by the measurement hardware logic circuitry whether the initial error is the particular error condition, the sub-portion comprising the at least one of the cells; and
failure detection hardware logic circuitry enabled to detect whether the at least one of the cells reprogrammed and read back includes a subsequent error, and record that the particular error condition is a first type of error condition responsive to the detection of whether the at least one of the cells includes the subsequent error.

13. The apparatus of claim 12, wherein the first type of error condition is one or more of programming failure and erase failure.

14. The apparatus of claim 12, wherein the determination hardware logic circuitry comprises decode hardware logic circuitry enabled to apply forward error correction decoding to a sub-portion of the particular portion, the sub-portion comprising the at least one of the cells.

15. The apparatus of claim 12, further comprising:
damage detection hardware logic circuitry enabled to detect that the first type of error condition is a cell damage error;
wear level hardware logic circuitry enabled to perform wear leveling on the one or more portions, based at least in part upon at least some results of the measuring; and
counter hardware logic circuitry enabled to update one or more cell damage counters associated with any one or more of:
the at least one of the cells,
a sub-portion of the particular portion, the sub-portion comprising the at least one of the cells, and
the particular portion.

16. The apparatus of claim 15, wherein the wear level hardware logic circuitry comprises selection hardware logic circuitry enabled to select ones of the portions to write based at least in part on values of the cell damage counters associated with the portions.

17. A tangible computer readable medium having a set of instructions stored therein that when executed by a processing element cause the processing element to perform and/or control operations comprising:
in a Non-Volatile Memory (NVM) comprising one or more portions, each of the one or more portions comprising one or more cells,
detecting an initial error for one or more of the cells,
determining whether the initial error is a particular error condition;
reprogramming at least a sub-portion of the particular portion and reading back the at least one of the cells if the initial error is the particular error condition, the sub-portion comprising the at least one of the cells:
detecting whether the at least one of the cells reprogrammed and read back includes a subsequent error; and
responsive to detecting whether the at least one of the cells includes a subsequent error, recording that the particular error condition is first type of error condition.

18. The tangible computer readable medium of claim 17, wherein the first type of error condition is one or more of programming failure and erase failure.

19. The tangible computer readable medium of claim 17, wherein the determining comprises applying forward error correction decoding to a sub-portion of the particular portion, the sub-portion comprising the at least one of the cells.

20. The tangible computer readable medium of claim 17, detecting that the first type of error condition is a cell damage error;
measuring cell damage for the one or more of the cells; and
performing wear leveling on the portions, based at least in part upon at least some results of the measuring, wherein the measuring further comprises updating one or more cell damage counters associated with any one or more of:
  the at least one of the cells,
  a sub-portion of the particular portion, the sub-portion comprising the at least one of the cells, and
  the particular portion.

21. The tangible computer readable medium of claim 20, wherein the performing comprises selecting ones of the portions to write based at least in part on values of the cell damage counters associated with the portions.

22. The tangible computer readable medium of claim 21, wherein the selecting is further based upon a cell damage threshold.

* * * * *